(12) United States Patent
Chan et al.

(10) Patent No.: US 6,525,617 B1
(45) Date of Patent: Feb. 25, 2003

(54) BUFFERING FOR LC-BASED STAGE

(75) Inventors: Edwin Chan, San Jose, CA (US); Ming Qu, San Jose, CA (US); Ji Zhao, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 55 days.

(21) Appl. No.: 09/927,612

(22) Filed: Aug. 9, 2001

(51) Int. Cl.$^7$ ............................................. H03B 27/60
(52) U.S. Cl. ...................... 331/57; 331/105; 331/108 A; 327/280; 327/281
(58) Field of Search ...................... 381/57, 105, 108 A; 327/280, 281

(56) References Cited

U.S. PATENT DOCUMENTS

| | | | |
|---|---|---|---|
| 5,485,126 A | * | 1/1996 | Gersbach et al. ............. 331/57 |
| 5,677,650 A | * | 10/1997 | Kwasniewski et al. ........ 331/57 |
| 5,917,383 A | * | 6/1999 | Tso et al. ..................... 331/57 |
| 5,929,714 A | * | 7/1999 | Nakamura .................... 331/57 |
| 5,936,475 A | * | 8/1999 | Tchamov et al. ............. 331/57 |
| 6,005,448 A | * | 12/1999 | Pickering et al. ............. 331/57 |
| 6,081,166 A | * | 6/2000 | Katakura ...................... 331/57 |
| 6,137,370 A | * | 10/2000 | Yamamoto .................... 331/57 |
| 6,353,369 B1 | * | 3/2002 | Boerstler ..................... 331/57 |

OTHER PUBLICATIONS

Ting–Ping Liu, "A 6.5GHz Monolithic CMOS Voltage–Controlled Oscillator", IEEE International Solid–State Circuits Conference, ISSCC99/Session 23 /Paper WP 23.7, pp. 404–405, Feb. 17, 1999.

Jafar Savoj, et al., "A 10Gb/s CMOS Clock and Data Recovery Circuit with Frequency Detection", 2001 IEEE International Solid–State Circuits Conference, ISSCC 2001/Session 5/Gigabit Optical Communications I/5.3, pp. 78–79. Feb. 2001.

* cited by examiner

*Primary Examiner*—Don Le
*Assistant Examiner*—Lam T. Mai

(57) ABSTRACT

A two-stage ring oscillator system that provides a phase shift of 90° in each of the two stages. Each stage includes an LC-based stage including a voltage controlled oscillator (VCO) and an in-line signal buffer that provides an additional controllable phase shift in the forward path and reduces loading capacitance of each LC-based stage by an estimated 10–50 percent. In-phase and quadrature output signals are provided by the system.

14 Claims, 3 Drawing Sheets

BUFFERING FOR LC-BASED STAGE

FIELD OF THE INVENTION

This invention relates to control of phase shift for a ring oscillator.

BACKGROUND OF THE INVENTION

A conventional approach for an LC-based ring oscillator uses three LC stages, with a phase shift sum for the three stages being 180°, as required to support an oscillation. Use of three or four stages is necessary with a conventional approach, because any stage provides a phase shift of less than 90°, except at certain extreme or unrealistic choices of parameter values. In the simplest three-stage oscillator, each stage provides 60° of phase shift. This arrangement is not suitable for applications that require in-phase and quadrature clock signals that are spaced 90° apart. Some workers have attempted to handle this problem by providing a four-stage ring oscillator in which each stage provides a 45° phase shift. See, for example, J. Savoj and B Razavi, "A 10 GB/s CMOS Clock and Data recovery Circuit with Frequency Detection", 2001 I.E.E.E. International Solid State Circuits Conference Digest, Technical Paper No. 5.3.

What is needed is an LC-based ring oscillator configuration that provides 90°, or preferably more, phase shift in each of two stages so that in-phase and quadrature signals, including but not limited to clock signals, can be generated using output signals from two successive stages of the oscillator.

SUMMARY OF THE INVENTION

These needs are met by the invention, which uses selected signal buffers plus selected LC circuits to provide additional phase shift in each stage so that, optionally, each stage can provide a 90° phase shift without using extreme values to attain this. The additional phase shift is provided by two in-line buffers, incorporated in the forward path, each providing an additional phase shift (estimated to be 0–30°, depending upon the configuration used).

DESCRIPTION OF BEST MODES OF THE INVENTION

Figure 1:
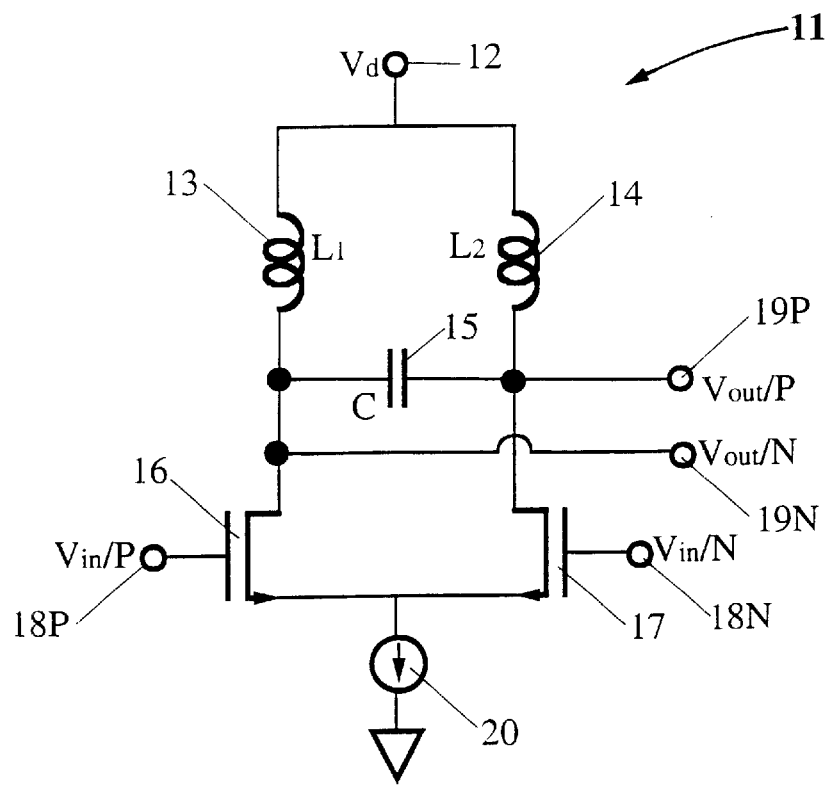
FIG. 1 schematically illustrates an LC-based stage of a conventional ring oscillator.
Figure 2:
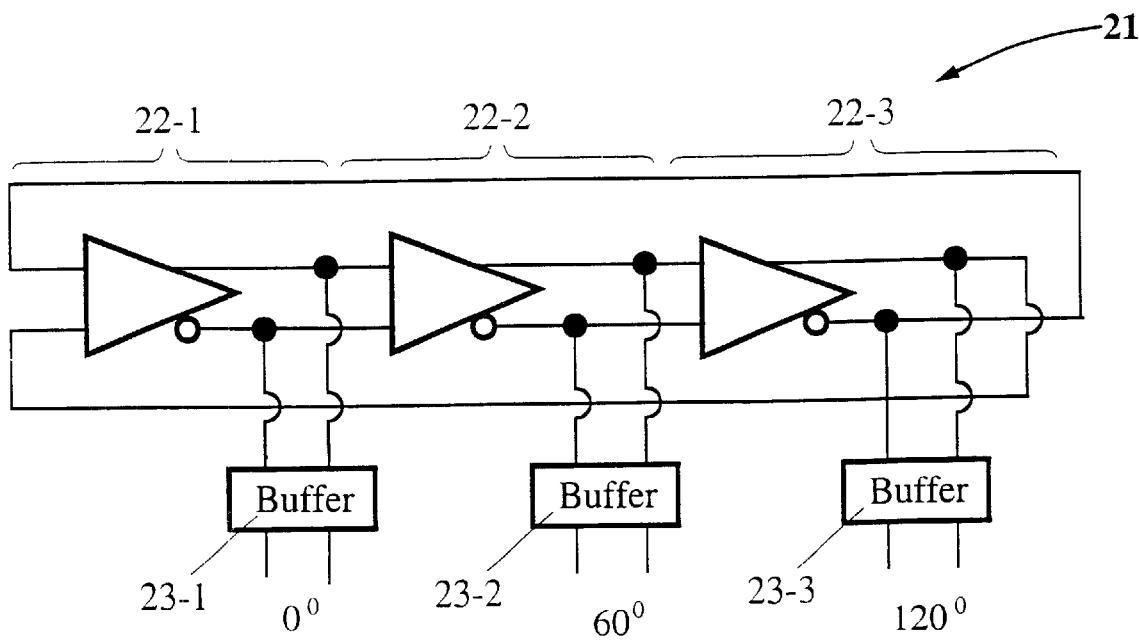
FIG. 2 schematically illustrates a three-stage ring oscillator, according to the prior art, that provides 180° phase shift FIGS. 3A and 3B graphically illustrate impedance magnitude and impedance phase associated with an LC tank circuit in the configuration of FIG.

FIG. 1 schematically illustrates an LC circuit 11 used in each stage of a conventional three-stage ring oscillator, such as the oscillator 21 shown in FIG. 2. The circuit 11 includes two parallel inductors (inductances L), 13 and 14, each connected at a first end to a selected voltage source 12 ($V_d$), and each connected at a second end to first and second ends of a capacitor (capacitance C) 15, respectively. The second ends of the inductors, 13 and 14, are also connected to a current source 20 through respective first and second NMOS transistors, 16 and 17, whose gates are connected to respective first and second polarity signal input terminals, 18P and 18N. The second ends of the inductors, 13 and 14, are connected to respective first and second polarity signal output terminals, 19N and 19P. The circuit 11 has an associated frequency-dependent output impedance given approximately by $$Z(\omega)=(R+j\omega L)/\{0.5-LC\omega^2+jRC\omega\}, \qquad (1)$$

where R is a series resistance in an inductor.

Figure 3A:
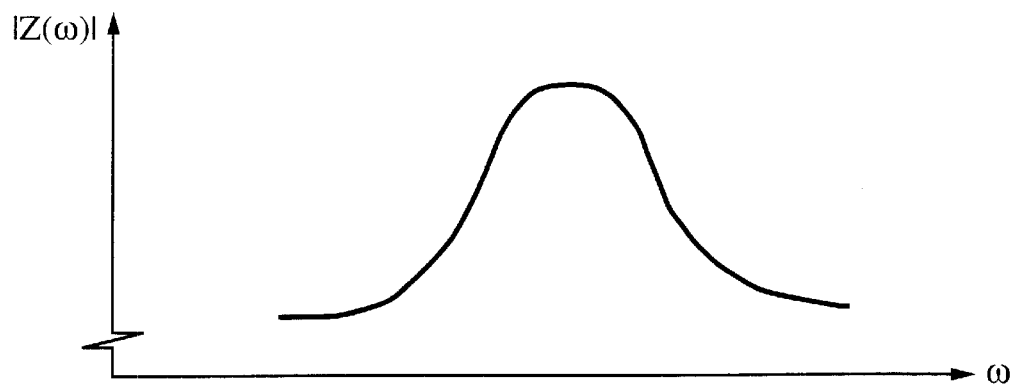
Figure 3B:
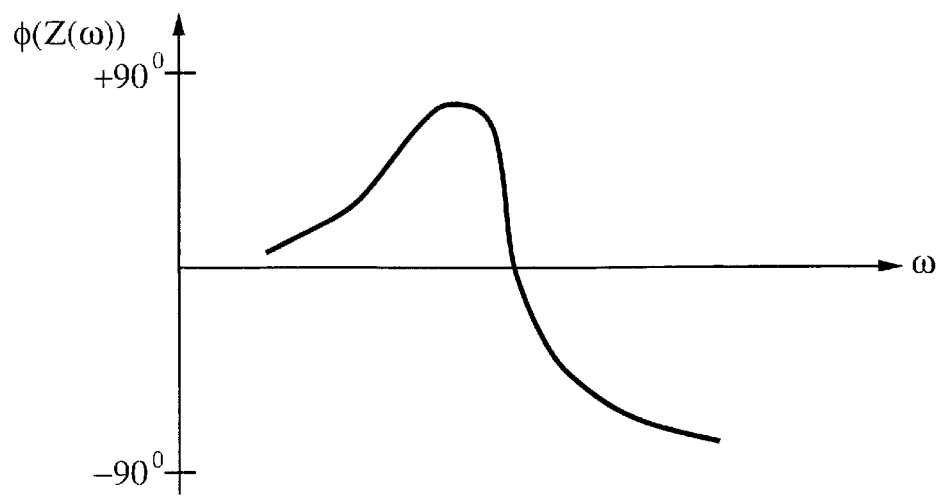

FIGS. 3A and 3B illustrate impedance magnitude and impedance phase associated with an LC tank circuit. A phase shift value of ±90° is not practically attainable, as indicated in FIG. 3B. Consequently, at least three stages, 22A, 22B and 22C, each having a phase shift of about 60°, are used, as illustrated in FIG. 2, to provide a total phase shift of 180° in the forward path. Each stage 22-j (j=1, 2, 3) has first and second input signal terminals and has an associated buffer 23-j that receives input signals from two output signal terminals of the stage 22-j outside the loop in a "buffer-out-of-loop" configuration. The three pairs of these output signals have associated phase shifts of 0°, 60°, and 120°.

The output signals from the stage 22-j' (j'=1, 2) are received by corresponding input signal terminals for the stage 22-(j'+1), and the output signals from the stage 22-3 are received with reversed polarities at the input signal terminals of the first stage 22-1, in a ring oscillator configuration that is familiar to those of skill in this technical area.

Figure 4:
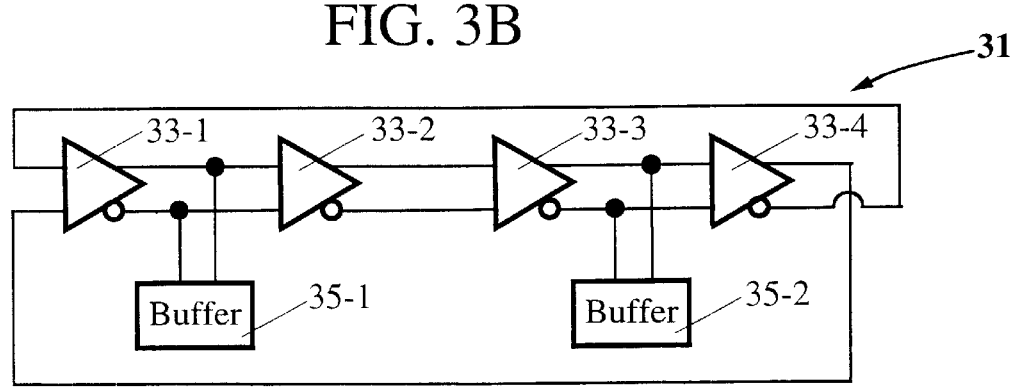
FIG. 4 schematically illustrates a conventional four-stage ring oscillator that provides 180° phase shift.

FIG. 4 schematically illustrates a conventional ring oscillator configuration 31 that provides an overall phase shift of 180° in the forward path, using four LC-based stages 33-k (k=1, 2, 3, 4) that each provides 45° of phase shift. Two output terminals for stage k' are connected to two input terminals for stage k'+1 (k'=1, 2, 3), and the output terminals for stage k=4 are crossed (with reversed polarity) and connected to two input terminals for stage k=1 as shown. The output signals of stages 1 and 3 are received by two signal buffers, 35-1 and 35-3 and provide buffer output signals with phase shifts of 0° and 90°, respectively. Here, the signal buffers, 35-1 and 35-3, are not in the ring oscillator loop of the system 31.

Because two pairs of unused output signals are generated at each of the stages 33-2 and 33-4, this will increase power consumption, and, use of four stages requires more area on a chip than would be required for a smaller number of stages.

Figure 5:
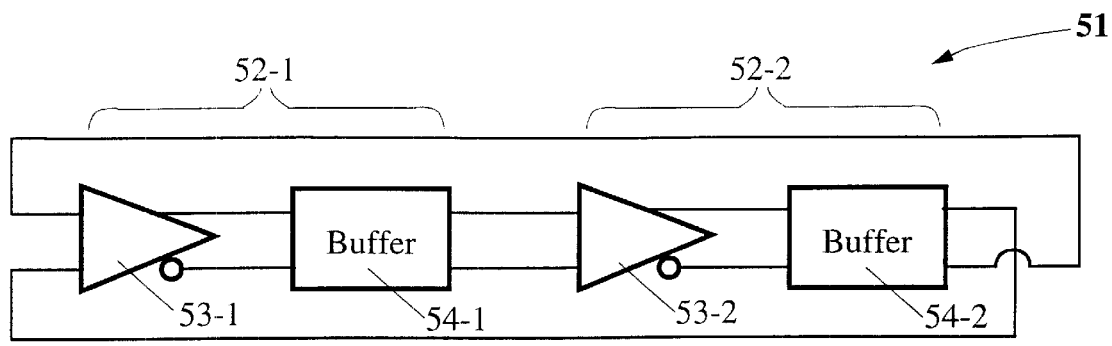
FIGS. 5, 6 and 7 schematically illustrate improved two-stage ring oscillators that provide 180° phase shift.

FIG. 5 schematically illustrates a two-stage ring oscillator system 51 constructed according to the invention. Stage 52-k (k=1, 2) includes an LC-based stage 53-k having two output terminals connected to two input terminals of an in-line signal buffer 54-k. Two output terminals of the buffer 54-1 are connected to two input terminals of the stage 53-2. Two output terminals of the second buffer 54-2 are crossed (reversed polarity) and connected to two input terminals of the first stage 53-1 as shown.

The two buffers, 54-1 and 54-2, are now part of the ring oscillator loop and are responsible for driving a load and for generating an additional phase shift φ (estimated to be 0°–30°) in the forward path for the system 51. This configuration allows the phase shift requirement for each of the LC-tuned stages 53-k to be reduced to 90°–φ. Further, each LC-tuned stage, 54-1 and 54-2, now drives only a buffer in the forward path, rather than driving both a buffer and other components, as in the parallel combination shown in FIG. 4. The series combination of components shown in FIG. 5 reduces the capacitive loading to each LC-tuned stage by an estimated 10–50 percent, relative to a parallel combination of components, such as the one shown in FIG. 4. The series combination increases the center frequency and/or the frequency tuning range of the system 51 in FIG. 5, relative to the corresponding values for the system 31 in FIG. 4.

Figure 6:
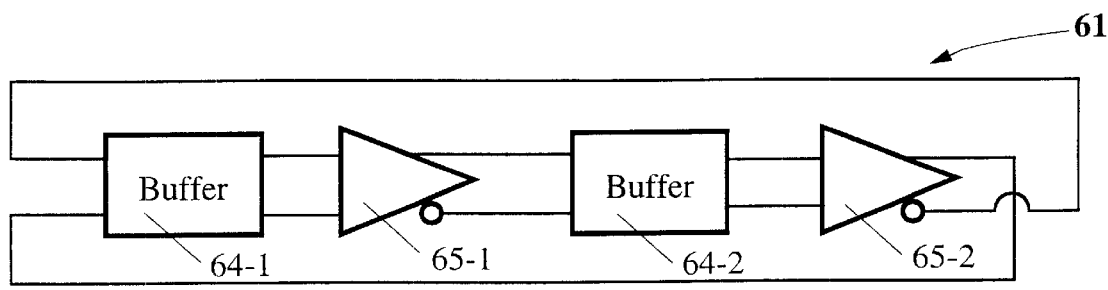

Because the system 51 in FIG. 5 is configured as a ring, the components can be rearranged cyclically to perform the same signal processing. In FIG. 6, the (equivalent) system 61 includes a first buffer 64-1, a first LC-tuned stage 65-1, a second buffer 64-2 and a second LC-tuned stage 65-2, arranged serially as shown, with the output terminals of the second stage 65-2 having reversed polarity relative to the respective input terminals of the first buffer 64-1 to which these output terminals are connected.

Figure 7:
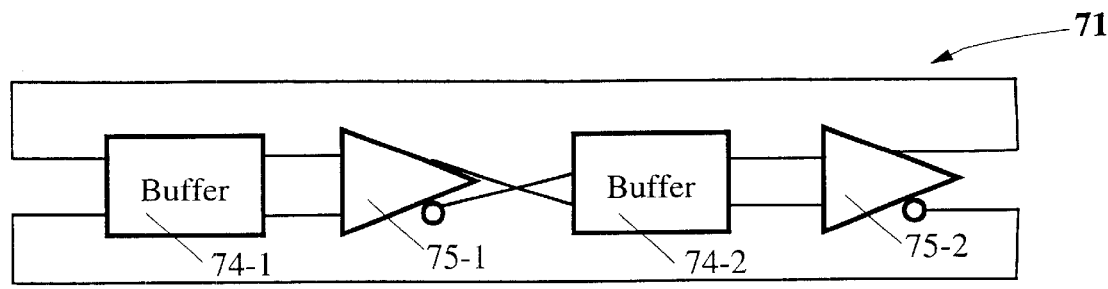

The polarity reversal at the last component in the ring (54-2 in FIG. 5 and 65-2 in FIG. 6) can be implemented at any of the other position shown in either of these Figures. For example, in the system 71 shown in FIG. 7, the polarity at the input terminals of the first stage 75-1 may be reversed relative to the polarity of the output terminals of the second buffer 74-2. In other respects, the system 71 in FIG. 7 has the same arrangement as the system 61 in FIG. 6.

What is claimed is:

1. A ring oscillator system comprising:
    a series combination comprising first and second LC-based stages and first and second buffers, each having at least two input terminals and at least two output terminals, where the output terminals of the first and second stages are connected to the input terminals of the first and second buffers, respectively, the output terminals of the first buffer are connected to the input terminals of the second stage, and the output terminals of the second buffer are connected with reversed polarity to the input terminals of the first stage; and
    wherein the first stage and first buffer are configured to provide a first signal having a first selected phase shift and the second stage and second buffer are configured to provide a second signal having a second selected phase shift at a selected frequency of oscillation.

2. The system of claim 1, wherein at least one of said first and second phase shifts is selected to be 90°, and each of said first and second stages has an associated phase shift that is substantially less than 90°.

3. The system of claim 1, wherein each of said first and second phase shifts is selected to be 90°, and each of said first and second stages has an associated phase shift that is substantially less than 90°.

4. The system of claim 1, wherein said first buffer is configured to have an associated phase shift $\phi(buf;1)$ in a range $0 \leq \phi(buf;1) \leq 30°$.

5. The system of claim 1, wherein said second buffer is configured to have an associated phase shift $\phi(buf;2)$ in a range $0 \leq \phi(buf;2) \leq 30°$.

6. The system of claim 1, wherein said series combination of said first stage and said first buffer has a loading capacitance that is reduced by a fraction in the range of 10–50 percent relative to loading capacitance of a first stage in a buffer-out-of-loop coupling system in which said output terminals of said first stage are connected to said input terminals of said first buffer and are connected to said input terminals of said second stage, and said output terminals of said second stage are connected to said input terminals of said second buffer and are connected with reversed polarity to said input terminals of said first stage.

7. The system of claim 1, wherein said series combination of said second stage and said second buffer has a loading capacitance that is reduced by a fraction in the range of 10–50 percent relative to loading capacitance of a second stage in a buffer-out-of-loop coupling system in which said output terminals of said first stage are connected to said input terminals of said first buffer and are connected to said input terminals of said second stage, and said output terminals of said second stage are connected to said input terminals of said second buffer and are connected with reversed polarity to said input terminals of said first stage.

8. A ring oscillator system comprising:
    a series combination of first and second LC-based stages and first and second buffers, each having two input terminals and two output terminals, where the output terminals of the first and second buffers are connected to the input terminals of the first and second stages, respectively, the output terminals of the first stage are connected to the input terminals of the second buffer, and the output terminals of the second stage are connected with reversed polarity to the input terminals of the first buffer; and
    wherein the first stage and first buffer are configured to provide a first signal having a first selected phase shift and the second stage and second buffer are configured to provide a second signal having a second selected phase shift at a selected frequency of oscillation.

9. The system of claim 8, wherein at least one of said first and second phase shifts is selected to be 90°, and each of said first and second stages has an associated phase shift that is substantially less than 90°.

10. The system of claim 8, wherein each of said first and second phase shifts is selected to be 90°, and each of said first and second stages has an associated phase shift that is substantially less than 90°.

11. The system of claim 8, wherein said first buffer is configured to have an associated phase shift $\phi(buf;1)$ in a range $0 \leq \phi(buf;1) \leq 30°$.

12. The system of claim 8, wherein said second buffer is configured to have an associated phase shift $\phi(buf;2)$ in a range $0 \leq \phi(buf;2) \leq 30°$.

13. The system of claim 8, wherein said series combination of said first stage and said first buffer has a loading capacitance that is reduced by a fraction in the range of 10–50 percent relative to loading capacitance of a first stage in a buffer-out-of-loop coupling system in which said output terminals of said first stage are connected to said input terminals of said first buffer and are connected to said input terminals of said second stage, and said output terminals of said second stage are connected to said input terminals of said second buffer and are connected with reversed polarity to said input terminals of said first stage.

14. The system of claim 8, wherein said series combination of said second stage and said second buffer has a loading capacitance that is reduced by a fraction in the range of 10–50 percent relative to loading capacitance of a second stage in a buffer-out-of-loop coupling system in which said output terminals of said first stage are connected to said input terminals of said first buffer and are connected to said input terminals of said second stage, and said output terminals of said second stage are connected to said input terminals of said second buffer and are connected with reversed polarity to said input terminals of said first stage.

* * * * *